United States Patent [19]

Lohstroh et al.

[11] Patent Number: 4,680,619
[45] Date of Patent: Jul. 14, 1987

[54] SEMICONDUCTOR DEVICE HAVING SILICON CONDUCTOR TRACKS CONNECTED BY A METAL SILICIDE TRACK

[75] Inventors: Jan Lohstroh; Wilhelmus J. M. J. Josquin, both of Eindhoven, Netherlands

[73] Assignee: U.S. Philips Corporation, New York, N.Y.

[21] Appl. No.: 645,897

[22] Filed: Aug. 31, 1984

[30] Foreign Application Priority Data

Sep. 15, 1983 [NL] Netherlands ............. 8303179

[51] Int. Cl.⁴ ........................................... H01L 29/04
[52] U.S. Cl. ........................................ 357/86; 357/59; 357/71; 357/67
[58] Field of Search ................ 357/67 S, 71 S, 71 P, 357/59, 86, 68

[56] References Cited

U.S. PATENT DOCUMENTS

| | | | |
|---|---|---|---|
| 4,161,745 | 7/1979 | Slob | 357/68 |
| 4,333,099 | 6/1982 | Tanguay | 357/67 S |
| 4,336,550 | 6/1982 | Medwin | 357/59 |
| 4,412,239 | 10/1983 | Iwasaki | 357/71 S |
| 4,449,287 | 5/1984 | Maas | 357/34 |
| 4,476,482 | 10/1984 | Scott | 357/59 |
| 4,543,595 | 9/1985 | Vora | 357/86 |
| 4,622,575 | 11/1986 | Vora et al. | 357/86 |

FOREIGN PATENT DOCUMENTS 56-94671 6/1981 Japan.
8105920 7/1983 Netherlands.

Primary Examiner—Andrew J. James
Assistant Examiner—Mark Prenty
Attorney, Agent, or Firm—Robert T. Mayer; Steven R. Biren

[57] ABSTRACT

Two (polycrystalline) silicon tracks located at a relative distance of the order of submicrons which contact the subjacent semiconductor body with a pn junction formed therein, are connected to each other via a metal silicide track. The resulting shortcircuiting of the pn junction does not influence the operation of the circuit, for example, a memory cell, realized in the semiconductor body. By providing the whole conductor pattern with an oxide layer in which a contact hole is formed at the area of the shortcircuit, the latter can then be provided in a self-aligning manner.

8 Claims, 11 Drawing Figures

SEMICONDUCTOR DEVICE HAVING SILICON CONDUCTOR TRACKS CONNECTED BY A METAL SILICIDE TRACK

BACKGROUND OF THE INVENTION

The invention relates to a semiconductor device comprising a semiconductor body of silicon having at a first main surface a conductor structure consisting of conductor tracks which are spaced apart, which comprise silicon of opposite conductivity types and which are connected to each other in an electrically conducting manner.

With the increasing reduction of the dimensions of constructional elements in integrated circuits, inter alia in order to obtain a higher packing density, use is increasingly made of self-aligning techniques. In these techniques, especially polycrystalline semiconductor materials, notably polycrystalline silicon, are increasingly utilized. Parts of a polycrystalline silicon track then act also as a doping source for the subjacent semiconductor material after having been doped in a suitable manner. However, the case may then arise that in one polycrystalline conductor track different dopants are provided, which, though they cause regions of different conductivity types to be formed in the subjacent semiconductor body, as a consequence may give rise to the formation of an undesired pn junction in the conductor track.

Such an undesired pn junction may be short-circuited by a conductive connection in the form of a strip of conducting material provided between the oppositely-doped tracks. Dependent upon the technology used, various solutions of this problem have been suggested. The conductive material may be provided afterwards by providing a metal strip on the pn junction or by silicidation of the silicon on either side of the pn junction (see for example Dutch Patent Application Nr. 8105920 laid open to public inspection on July 18$^{th}$ 1983 and Japanese Kokai Nr. 56-94671).

A semiconductor device of the kind mentioned in the opening paragraph is known from Dutch Patent Application Nr. 8105559 laid open to public inspection on July 1$^{st}$, 1983. In this Application, the oppositely doped tracks of polycrystalline silicon to be connected to each other are spaced apart by a certain distance and are separated from each other by a groove generally filled with oxide.

In Patent Application Nr. 810559, two such regions are mutually shortcircuited by means of a layer of conductive material which is provided beforehand at the area of the groove (see for example FIGS. 39 to 45 of the Application).

In practice, however, to obtain simpler processing, such a connection is perferably provided afterwards, together with other conductor tracks, contact metallizations or, for example, a metal which forms a Schottky diode with the subjacent silicon.

SUMMARY OF THE INVENTION

A device according to the invention is characterized in that at least at the area of the conductive connection the conductor tracks are located on the semiconductor surface and are connected to each other by means of a layer of metal silicide which is located on the semiconductor surface between the conductor tracks and which contacts parts of the conductor tracks.

The invention is based on the recognition of the fact that in given applications, notably in the manufacture of very small memory cells, such a connection can be situated directly on the semiconductor surface without the function of the subjacent semiconductor region being influenced by a partial doping of an opposite conductivity type.

It is further based on the recognition of the fact that such a configuration (polycrystalline silicon on monocrystalline silicon) is very suitable for a shortcircuit obtained by silicidation because such metal silicides adhere satisfactorily both to the two regions of polycrystalline silicon and to the intermediate monocrystalline silicon and form with these regions good electrically conducting connections. This has the consequence that the connection may be manufactured, if desired, entirely in a self-aligning manner. Such a device is characterized in that the conductor tracks are coated with an oxide layer having a contact window at the area of the conductive connection, the metal silicide being situated only within the contact window.

BRIEF DESCRIPTION OF THE DRAWING

The invention will now be described more fully with reference to an embodiment and the drawing, in which.

Figure 1:
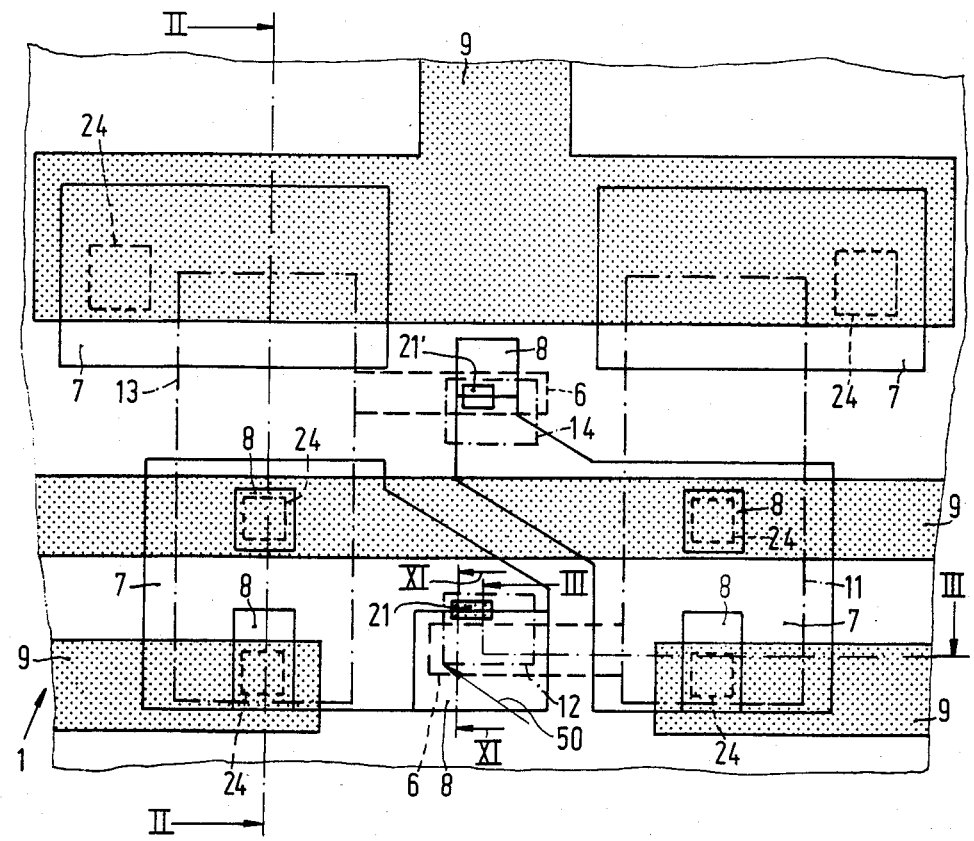
FIG. 1 is a plan view of a semiconductor device according to the invention.

The Figures are schematic and not drawn to scale, while for the sake of clarity dimensions in the direction of thickness are highly exaggerated in the cross-sections. Semiconductor zones of the same conductivity type are generally cross-hatched in the same direction; in the Figures, corresponding parts are generally designated by the same reference numerals.

DESCRIPTION OF THE PREFERRED EMBODIMENT

The memory cell of FIGS. 1 to 4 comprises a semiconductor body 1 having at a major surface 2 two cross-coupled npn transistors 25, 25', whose emitters 18, 18' are connected to each other and are further connected to a first word line 27, while the collector of the transistor 25 is connected to the base of the transistor 25' and the collector of the transistor 25' is connected to the base of the transistor 25. The load is constituted by pnp transistors 20, 20', whose emitters 15, 15' are connected to a second word line 28, while the bases (16, 16') and the collectors (17, 17') at the same time constitute the collectors and bases of the cross-coupled transistors 25, 25'. The last-mentioned transistors moreover each have a second emitter 19, 19', which is connected to a bit line 29, via which information can be written or read.

The active regions in which the transistors 20, 20', 25, 25' are formed are insulated from each other by means of a layer of sunken oxide 3, whose boundary is indicated in FIG. 1 by dot-and-dash lines 11, 12, 13, 14. The semiconductor body comprises a p-type substrate 4 on which an epitaxial layer 5 of the n-type is grown. In order to reduce the collector series resistance, the semiconductor device is futher provided with buried layers 6, which pass underneath the sunken oxide at the desired areas. At the areas at which the buried layers 6 extend outside the regions 10, 11, 12, 13 under the sunken oxide 3 this is indicated in FIG. 1 by broken lines. A pattern of polycrystalline silicon tracks, which are either p-type conducting (reference numeral 7) or n-type conducting (reference numeral 8), and a metallization pattern 9 extend on the surface 2. Where required, polycrystalline silicon regions of opposite conductivity type are mutually separated by an electrically insulating layer 10 of, for example, silicon oxide. This layer 10 also insulates the conductor tracks 9 from the polycrystalline silicon and acts at other areas as a protective layer.

A lateral pnp transistor 20 is formed in each of the openings 11, 13 in the sunken oxide, where (see FIG. 2) the p-type region 15 acts as the emitter, the n-type conducting region 16 forming part of the epitaxial layer 5 acts as the base and the p-type region 17 acts as the collector. The n-type region 16 constitutes together with the buried layer 6 and a part of the epitaxial layer 5 the collector of an npn transistor 25, whose base is constituted by a p-type region 17 and which has two emitter regions 18, 19. The p-type region 17 is further provided with p-type contact zones 26.

In order to obtain a conductive connection between the p-type polycrystalline silicon track 7 contacting the base zone 17 of the memory transistor 25 and the collector 16' of the memory transistor 25' cross-coupled with the transistor 25, the semiconductor device shown in FIGS. 1 to 4 comprises at the area of the opening 12 in the sunken oxide a shortcircuit 21 between the said p-type polycrystalline silicon track 7 and an n-type polycrystalline silicon track 8 contacting an n+-region 22 within the opening 12. The said p-type track 7 contacts a p-type region 23 which does not adversely affect the operation of the circuit. The shortcircuit 21 itself is constituted, for example, by a layer of platinum silicide having a thickness of about 50 nm. Via the p-type track 7, the platinum silicide 21 contacting both the two polycrystalline tracks 7, 8 and the surface of the epitaxial layer between said tracks and the n-type zones 22, 5, 6, a low-ohmic connection is now formed between the base 17 of the transistor 25 and the collector 16' of the transistor 25' cross-coupled with the transistor 25. Via a similar short circuit 21' at the area of the opening 14 in the sunken oxide, the p-type polycrystalline layer 7 contacting the base of the transistor 25' is connected in an electrically-conducting manner to an n-type polycrystalline semiconductor region 8 and an intermediate exposed semiconductor region where the area at which the buried region 6 extends, which buried region forms part of the collector of the transistor 25.

Such shortcircuits 21 of tracks of polycrystalline silicon spaced apart by a small distance are possible according to the invention because the conductivity type of the subjacent semiconductor region is mainly determined by the impurities which determine the conductivity type of one polycrystalline silicon track, whereas impurities originating from the other polycrystalline silicon track do not influence the actual operation of the shortcircuited contact in the electric circuit, in this case a memory circuit. In the present example, the word and bit lines are present further in the form of aluminum tracks 9 which, where required, contact the subjacent polycrystalline silicon via contact holes 24.

Figure 2:
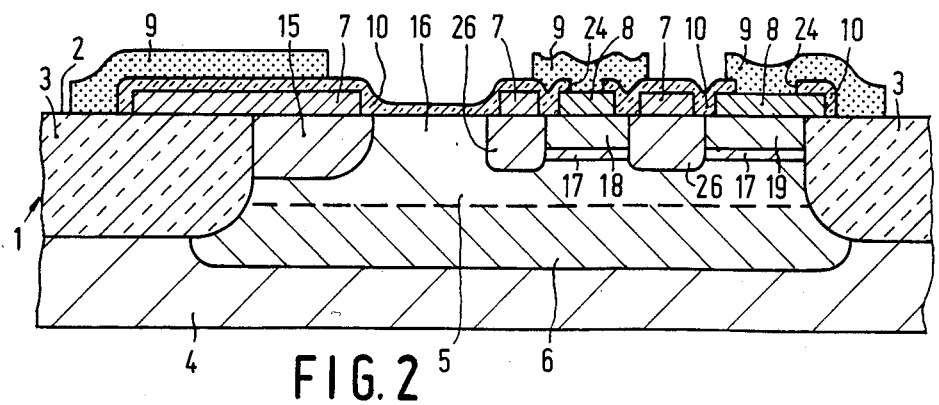
FIG. 2 is a cross-sectional view taken on the line II—II in FIG. 1.
Figure 3:
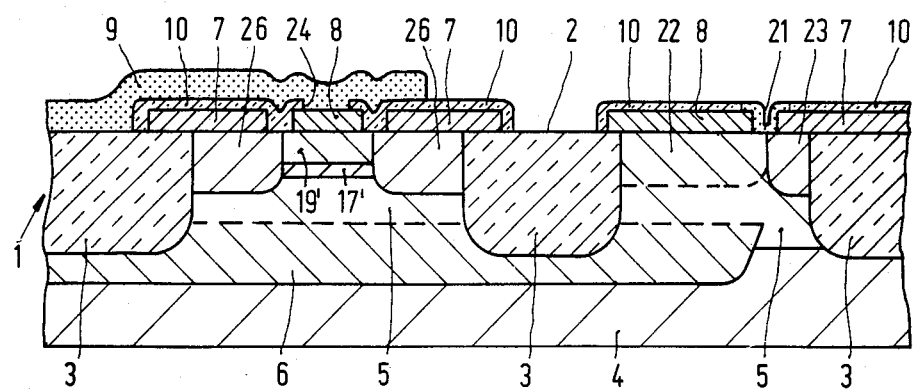
FIG. 3 is a cross-sectional view taken on the line III—III in FIG. 1, the bending point in the line III—III being indicated by the arrow 50.
Figure 4:
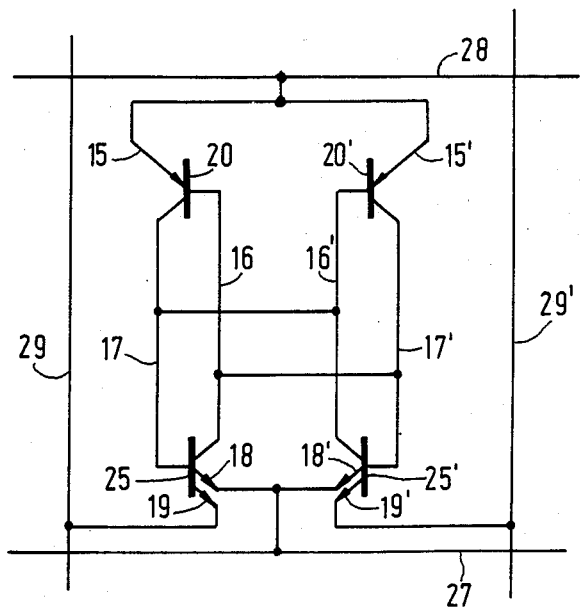
FIG. 4 shows an electrical circuit diagram of the device of FIG. 1.

A method of manufacturing the device according to FIGS. 1 to 3 will now be described with reference to FIGS. 5 to 9, which show diagrammatically in cross-section successive stages in manufacture, taken on the line XI—XI in FIG. 1.

The starting material is a semiconductor body 1 which is provided at its surface 2 with sunken oxide regions 3, which define active regions, in which the transistors 20, 25 are formed. The semiconductor body 1 is obtained, for example, by first defining the buried layers 6 in a p-type substrate 4 and by then growing the epitaxial layer 5 by means of generally-known techniques, after which the sunken oxide regions 3 are defined at the desired areas by means of local oxidation.

A first silicon layer 31, an overlying oxidation-preventing layer 32, in this example of silicon nitride, and an overlying oxidizable layer 33, in this example a second silicon layer, are successively deposited on the surface 2 of the semiconductor body 1 by the use of deposition methods generally known in semiconductor technology. Moreover, a further oxidation-preventing layer 34 having a larger thickness than the layer 32 and consisting in this example also of silicon nitride is further formed on the second silicon layer 33. It should further be noted that between the silicon nitride layers 32 and 34 and the subjacent silicon layers 31 and 33 a very thin oxide layer (not shown) is sometimes provided. The layers 31 and 33 in this example are substantially undoped polycrystalline silicon layers having a thickness of 0.5 $\mu$m and 0.35 $\mu$m, respectively. The nitride layers 32 and 34 have a thickness of 74 nm and 150 nm, respectively.

Figure 5:
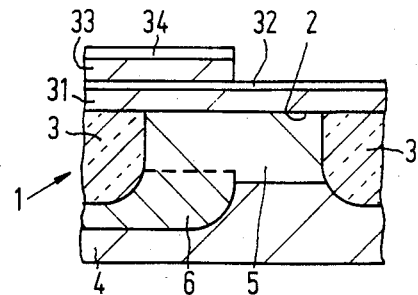
FIGS. 5 to 11 show in cross-section taken on the line XI—XI in FIG. 1 successive stage of manufacture of the device according to FIGS. 1 to 4.
Figure 6:
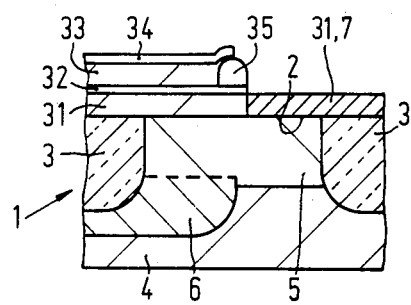
Figure 7:
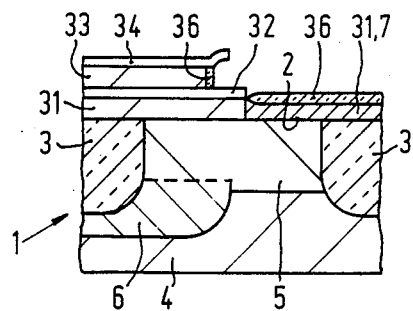

By successively etching the layers 34 and 33, in which process a photolacquer mask may be used as an etching mask, the second silicon layer 33 is removed above a part of the surface of the layer 31. Thus, the situation shown in FIG. 5 is obtained.

Subsequently, an edge portion 35 of the remaining part of the oxidizable silicon layer 33 is oxidized throughout its thickness. The silicon nitride layers 32 and 34 protect the subjacent silicon layes 31 and 33 from oxidation. The oxidized edge portion 35 in this example has a width of about 0.9 $\mu$m (see FIG. 6).

The uncovered part of the first oxidation-preventing layer 32 (inclusive of a possibly subjacent very thin oxide layer) is then removed. The nitride layer 34 is partly maintained because it is thicker than the layer 32. Subsequently, the oxidized edge portion 35 is removed by means of etching, after which the exposed part of the first silicon layer 31 is oxidized by heating in an oxygen-containing atmosphere over part of its thickness, just like the edge of the layer 33. As a result, a thermal oxide layer 36 having a thickness of, for example, 0.15 $\mu$m, is formed. At the area of the original edge portion 35, a part (approximately 0.8 $\mu$m) of the nitride layer 32 remains uncovered (see FIG. 7).

Figure 8:
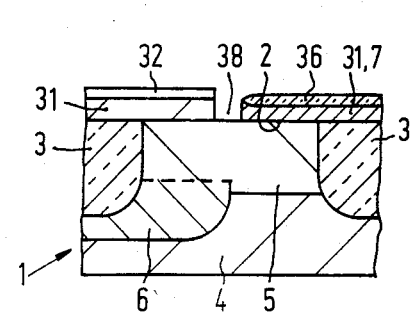
Figure 9:
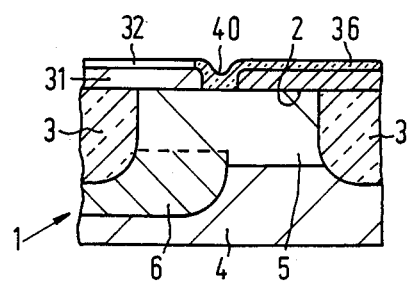

Subsequently, the second oxidation-preventing layer 34 and the part of the oxidation-preventing layer 32 exposed by the removal of the edge portion 35 are then successively removed by etching. Then the polycrystalline silicon layer 33 is etched away, in which process also a groove 38 is etched into the layer 31 at the area of the exposed polycrystalline silicon of this layer. Thus, the situation shown in FIG. 8 is obtained. Subsequently, an oxide layer 40 is formed in the groove, the part of the polycrystalline silicon layer 31 located under the remaining nitride layer 32 being protected from this thermal oxidation (see FIG. 9).

Figure 10:
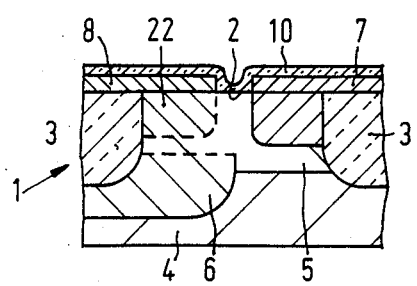

This remaining part of the layer 32 is then selectively etched away at the area of the collector contact regions to be formed, after which a donor implantation or diffusion, for example, with phosphorus, is carried out. The uncovered parts 8 of the silicon layer 31 then obtain a high n-type doping. When a phosphorus implantation is carried out, this may also take place when the layer 32 is still present. During the thermal treatment associated with this doping and also during the later formation of thermal oxide, the arsenic diffuses from the layer 1 into the subjacent semiconductor body and there forms the n-type collector contact zone 22 (see FIG. 10).

In order to form the transistors and other semiconductor elements, after the stage shown in FIG. 5 has been reached, the parts of the silicon layer 31 not located under the layer 33 are doped with an acceptor, for example with boron. This may take place by means of ion implantation (which may be carried out through the nitride layer 32) both at the stage shown in FIG. 5 and at the stage shown in FIG. 6 and by means of diffusion immediately before the stage shown in FIG. 6. The highly doped p-type conducting parts 7 of the layer 31 thus obtained form good ohmic contacts on the p-type zones 23, 15 and 17 and at the same time act as a diffusion source for the zones 23, 15 and the base contact zones 26 for the p-type base zones 17. The second silicon layer 33 and the oxidized edge portion 35 thereof act as a mask during the said doping.

After the collector contact regions have been provided, the exposed parts of the layer 31 are covered with an oxide layer 10 by means of thermal oxidation. At the area of the emitter regions 18, 19 of the npn transistors, the remaining part of the nitride layer 32 is removed, after which at these areas the intrinsic bases 17 and the emitter regions 18, 19 are formed by means of a boron implantation and a subsequent arsenic implantation, respectively. For further details of the method described so far or variations thereof, reference may be made to Dutch Patent Application Nr. 810559.

In order to provide the shortcircuit, a contact window 39 is now formed in the oxide layer 10 at the area of the groove 38. The conductive connection 21 is formed in this contact window by silicidation of the surface 2 of the semiconductor body exposed in the groove 38 and of the polycrystalline silicon tracks 7,31 and 8,31.

Figure 11:
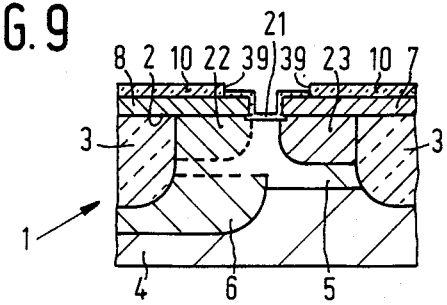

For this purpose, the semiconductor body is covered with a metal layer, in this case of platinum, which is then converted by heating into platinum silicide at those areas at which the platinum is in contact with silicon. The platinum left on the oxide layer 10 is then removed by etching. Thus, the platinum silicide is formed in a self-aligning manner inside the contact windows 39 (see FIG. 11). If desired, simultaneously with the shortcircuit 21, at other areas at which the silicon 13 is exposed, contacts of platinum silicide may be applied, which form, for example, with the subjacent silicon, a Schottky diode.

The platinum silicide is simultaneously formed in other contact windows 24 in the oxide layer 10, after which the surface is covered with an aluminum layer from which the metallization pattern 9 is formed photolithographically. Thus, the device shown in FIGS. 1 to 3 is obtained. The conductor tracks 7, 8, 9 may be provided, if required, with external connection conductors.

The invention is of course not limited to the embodiment described above. For example, for the oxidizable layers 31, 33 other oxidizable layer materials, such as aluminum, hafnium or zirconium, may be chosen. Additionally such a shortcircuit may alternatively be manufactured by other methods, in which two semiconductor tracks of opposite conductivity types are formed at a short relative distance (of the order of 1 $\mu$m or less), as is the case, for example, with the method shown in Japanese Kokai Nr. 54-154966 or in the article "1.25 $\mu$m Deep-Groove-Isolated Self-Aligned Bipolar Circuits" by D. D. Tang et al, published in I.E.E.E. Journal of Solid State Circuits, Vol. SC-17, Nr. 5, October 1982, pages 925–931.

The thin oxide, which in this case separates two polycrystalline silicon layers overlapping each other in part, is then etched away down to the semiconductor body, after which a metal silicide is formed again on the semiconductor body and on parts of the polycrystalline silicon layers. In order to avoid the difficulties involved in removing etching residues, which occur in such methods, however, the starting point is preferably a method in which, like in the method shown in the embodiment, the starting material is a single polycrystalline silicon layer, as shown, for example, in Proceedings of the I.E.E.E. International Solid State Circuits Conference, February 1981, pages 216–217 or in the article "A 3-ns 1-kBIT RAM Using Super-Self-Aligned Process Technology", by T. Sakai et al, published in I.E.E.E. Journal of Solid State Circuits, Vol. SC-16, Nr. 5, October 1981, pages 424–429.

What is claimed is:

1. A semiconductor device comprising a semiconductor body of silicon having a first main surface, a conductor structure with conductor tracks which are spaced apart at said surface, which tracks comprise silicon of two opposite conductivity types and which are connected to each other in an electrically conducting manner, and a layer of metal silicide, at least at the area of the conductive connection the conductor tracks being located on the semiconductor surface and being connected to each other by said layer of metal silicide which is located on the semiconductor surface between the conductor tracks and which contacts parts of the conductor tracks, said layer of metal silicide connecting together said conductor tracks and said semiconductor surface.

2. A semiconductor device as claimed in claim 1, characterized in that the conductor tracks are spaced apart by a distance of at most 1 $\mu$m.

3. A semiconductor device as claimed in claim 1 or 2, characterized in that the conductor tracks are covered by an oxide layer having a contact window at the area of the conductive connection, the metal silicide being situated only inside the contact window.

4. A semiconductor device as claimed in claim 1 or 2, characterized in that a pn junction is located in the semiconductor body underneath the conductive connection, which junction is shortcircuited by the conductive connection.

5. A semiconductor device as claimed in claim 1 or 2, characterized in that the conductor tracks comprise polycrystalline silicon.

6. A semiconductor device as claimed in claim 4, further comprising a transistor, characterized in that at least one of the semiconductor zones forming the pn junction forms at least a part of a contact zone which contacts an active region of said transistor.

7. A semiconductor device as claimed in claim 1 or 2, further comprising two cross-coupled transistors, characterized in that the electrically-conductive connections are formed between conductor tracks of a first conductivity type, which contact the bases of said two cross-coupled transistors, and conductor tracks of a second conductivity type opposite to the first conductivity type, which contact the collectors of said transistors.

8. A semiconductor device as claimed in claim 7, further comprising a static memory cell, characterized in that said cross-coupled transistors form part of said static memory cell.

* * * * *